(12) United States Patent
Lu et al.

(10) Patent No.: US 10,969,918 B2
(45) Date of Patent: Apr. 6, 2021

(54) TOUCH PANEL METAL GRID STRUCTURE WITH INCREASED MUTUAL CAPACITANCE

(71) Applicant: WUHAN CHINA STAR OPTOELECTRONICS TECHNOLOGY CO., LTD., Hubei (CN)

(72) Inventors: Peng Lu, Hubei (CN); Xiaoliang Feng, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 148 days.

(21) Appl. No.: 16/337,916

(22) PCT Filed: Sep. 28, 2018

(86) PCT No.: PCT/CN2018/108421
§ 371 (c)(1),
(2) Date: Mar. 28, 2019

(87) PCT Pub. No.: WO2020/019503
PCT Pub. Date: Jan. 30, 2020

(65) Prior Publication Data
US 2021/0004125 A1   Jan. 7, 2021

(30) Foreign Application Priority Data

Jul. 26, 2018 (CN) .......................... 201810832413.4

(51) Int. Cl.
*G06F 3/044* (2006.01)
*G02F 1/1333* (2006.01)
*H01L 27/32* (2006.01)

(52) U.S. Cl.
CPC ........ *G06F 3/0446* (2019.05); *G02F 1/13338* (2013.01); *H01L 27/323* (2013.01)

(58) Field of Classification Search
CPC ........... G06F 3/044; G06F 2203/04112; G06F 3/0414; G06F 3/0443; G06F 3/045;
(Continued)

(56) References Cited

U.S. PATENT DOCUMENTS

2014/0184527 A1   7/2014 Kim et al.
2015/0054803 A1*  2/2015 Yashiro ............... G02F 1/13439
                                                      345/206
(Continued)

FOREIGN PATENT DOCUMENTS

| CN | 104063108 A | 9/2014 |
|----|-------------|--------|
| CN | 104281320 A | 1/2015 |
| CN | 108052221 A | 5/2018 |

*Primary Examiner* — Nelson M Rosario
(74) *Attorney, Agent, or Firm* — Hamre, Schumann, Mueller & Larson, P.C.

(57) ABSTRACT

A touch panel metal grid structure with augmented mutual capacitance includes a substrate, a driver layer, a detection layer, and a capacitance detection device. The driver layer is disposed on the substrate. The driver layer includes a plurality of circular patterns and each two said circular patterns are connected together by using a bridge wire. The detection layer is disposed on the substrate. The detection layer includes a plurality of polarized quadrilateral patterns. Each of the polarized quadrilateral patterns is disposed correspondingly to each of the circular patterns to form a touch-sensing pattern. The capacitance detection device is electrically connected to the detection layer and the driver layer. Therefore, the present invention can enhance touch control signals and can effectively prevent a cathode and other electric fields from interfering in the signals.

14 Claims, 8 Drawing Sheets

(58) Field of Classification Search
CPC .... G06F 3/0412; G06F 3/0445; G06F 3/0447; G06F 2203/04101; G06F 2203/04102; G06F 2203/04105; G06F 2203/04111
See application file for complete search history.

(56) References Cited

U.S. PATENT DOCUMENTS

| | | | |
|---|---|---|---|
| 2016/0291717 A1 | 10/2016 | Fu et al. | |
| 2016/0342235 A1* | 11/2016 | Chang | G06F 3/044 |
| 2017/0045989 A1* | 2/2017 | Lee | G06F 3/045 |
| 2019/0187845 A1 | 6/2019 | Ye | |

* cited by examiner

TOUCH PANEL METAL GRID STRUCTURE WITH INCREASED MUTUAL CAPACITANCE

FIELD OF INVENTION

The present invention relates to a touch control screen, and more specifically, to a touch panel metal grid structure with augmented mutual capacitance in a display.

BACKGROUND

Compared with conventional thin film transistor-liquid crystal displays (TFT-LCD), organic light emitting diode (OLED) has advantages such as flexibility. OLED displays have various advantages, such as high contrast, thinness, wide viewing angles, quick response times, wide temperature ranges, and having simplified structure and manufacturing processes. Thus, OLED displays are widely used in several industries. Flexible OLED displays can be especially used on portable display devices, wearable devices, and display screens in the market or in other fields. As the mobile device screens are larger, sizes of the mobile devices become larger, and may result in poor portability. In order to solve those aforementioned issues, flexible displays are preferred because flexible displays having large screens can be folded to achieve great portability.

When preparing an embedded touch control layer on a display, a cathode and other electric fields can seriously interfere in signals of mutual capacitance of the touch control layer. Especially for flexible OLED displays, thinner encapsulation layers result in more noises. Therefore, the issues for how to increase mutual capacitance of the touch control layer to improve touch control sensibility should be solved for current embedded touch control displays. A conventional solution for those issues is to provide a pump designed for a drive circuit to increase the touch control signals. However, such a solution results in much more power consumption, which is a serious shortcoming for displays emphasizing power saving as their advantages. Thus, a new touch panel metal grid structure with augmented mutual capacitance is needed for solving those issues described above.

SUMMARY OF INVENTION

The present invention provides a touch panel metal grid structure with augmented mutual capacitance having a substrate, a driver layer, a detection layer and a capacitance detection device. The driver layer is disposed on the substrate. The driver layer includes a plurality of circular patterns and each two said circular patterns being connected together by using a bridge wire. The detection layer is disposed on the substrate. The detection layer includes a plurality of polarized quadrilateral patterns. The polarized quadrilateral patterns each disposed corresponding to each of the circular patterns to form a touch-sensing pattern. The capacitance detection device electrically connected to the detection layer and the driver layer. Therefore, the present invention can enhance the touch control signal and effectively prevent the cathode and other electric fields from interfering the signals.

One embodiment of the present invention provides a touch panel metal grid structure with augmented mutual capacitance having a substrate, a driver layer, a detection layer and a capacitance detection device. The driver layer is disposed on the substrate. The driver layer includes a plurality of circular patterns and each two said circular patterns being connected together by using a bridge wire. The detection layer is disposed on the substrate. The detection layer includes a plurality of polarized quadrilateral patterns. The polarized quadrilateral patterns each disposed corresponding to each of the circular patterns to form a touch-sensing pattern. The capacitance detection device electrically connected to the detection layer and the driver layer.

In some embodiments, each of the circular patterns and each of the polarized quadrilateral patterns are insulated from each other by using an annular gap section.

In some embodiments and in the touch panel metal grid structure with augmented mutual capacitance, wherein the annular gap section is disposed outside a corresponding circular pattern and has a disconnect width of 1 µm-20 µm.

In some embodiments and in the touch panel metal grid structure with augmented mutual capacitance, wherein an insulating layer covering the driver layer and the detection layer.

In some embodiments and in the touch panel metal grid structure with augmented mutual capacitance, wherein the substrate is an organic light emitting diode (OLED) display panel, a liquid crystal display (LCD), a glass substrate or a thin film substrate.

In some embodiments and in the touch panel metal grid structure with augmented mutual capacitance, wherein the thin film substrate comprises polyimide (PI), polyethylene terephthalate (PET) or cycle olefin polymer (COP).

The present invention provides another embodiment such as a touch panel metal grid structure with augmented mutual capacitance having a substrate, a driver layer, a detection layer, a capacitance detection device and an insulating layer. The driver layer is disposed on the substrate. The driver layer includes a plurality of drive components and each two said drive components being connected together by using a bridge wire. The detection layer is disposed on the substrate. The detection layer includes a plurality of sensing components. Each of the sensing components is disposed corresponding to each of the circular patterns to form a touch-sensing pattern. The capacitance detection device electrically connected to the detection layer and the driver layer. The insulating layer covers the driver layer and the detection layer.

In some embodiments and in the touch panel metal grid structure with augmented mutual capacitance, wherein the drive components are circular patterns. The sensing components are polarized quadrilateral patterns. The polarized quadrilateral patterns are disposed corresponding to the circular patterns to form a touch-sensing pattern. Each of the circular patterns and each of the polarized quadrilateral patterns are insulated from each other by using an annular gap section.

In some embodiments and in the touch panel metal grid structure with augmented mutual capacitance, wherein the annular gap section is disposed outside a corresponding circular pattern and has a disconnect width of 1 µm-20 µm.

In some embodiments and in the touch panel metal grid structure with augmented mutual capacitance, wherein the substrate is an organic light emitting diode (OLED) display panel, a liquid crystal display (LCD), a glass substrate or a thin film substrate.

In some embodiments and in the touch panel metal grid structure with augmented mutual capacitance, wherein the thin film substrate comprises polyimide (PI), polyethylene terephthalate (PET) or cycle olefin polymer (COP).

The present invention provides a touch panel metal grid structure to increase the mutual capacitance and enhance the touch control signal and effectively to prevent the cathode and other electric fields from interfering the signals by increasing the contact area of the drive circuit Tx and the sensing circuit Rx.

The accompanying figures in the description of embodiments of the present disclosure will be described in brief to more clearly illustrate the technical solutions of the embodiments.

DETAILED DESCRIPTION OF PREFERRED EMBODIMENTS

Figure 1:
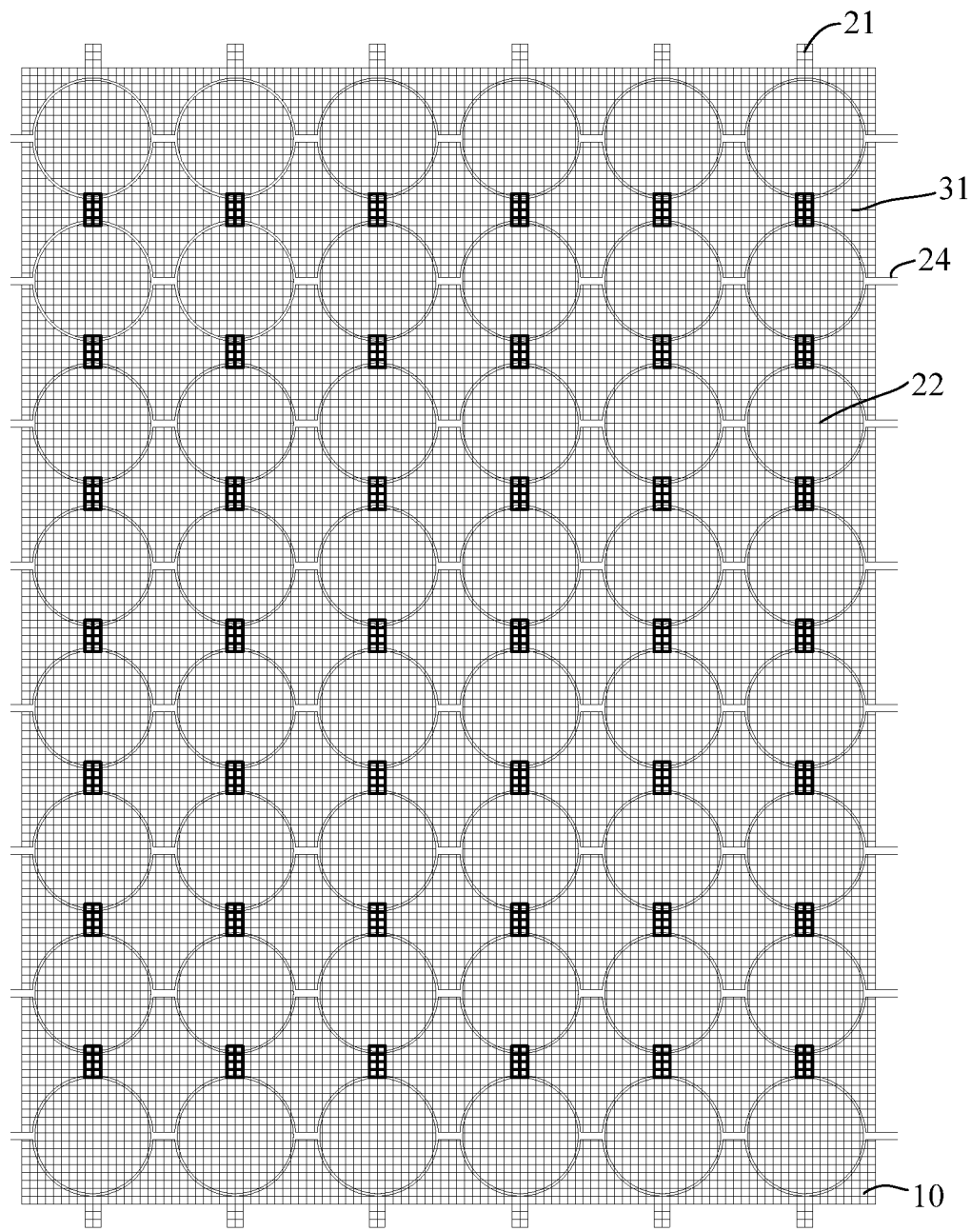
FIG. 1 is a schematic diagram of a touch panel metal grid structure to increase the mutual capacitance according to a first embodiment of the present invention.

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper," "lower," "front," "rear," "left," "right," "inside," "outside," "lateral," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

The present invention provides a touch panel metal grid structure with increased mutual capacitance having a substrate 10, a driver layer 20, a detection layer 30, and a capacitance detection device (not shown). The present invention provides a touch panel metal grid structure to increase the mutual capacitance enhance touch control signals, and effectively to prevent noise from interfering touch signals by increasing a contact area of a drive circuit Tx and a sensing circuit Rx.

The driver layer 20 is disposed on the substrate 10. The driver layer 20 includes a plurality of circular patterns 22 and each two said circular patterns 22 are connected together by using a bridge wire 21. The detection layer 30 is disposed on the substrate 10. The detection layer 30 includes a plurality of polarized quadrilateral patterns 31. Each polarized quadrilateral pattern 31 disposed corresponding to each of the circular patterns 22 to form a touch-sensing pattern. The capacitance detection device (not shown) is electrically connected to the detection layer 30 and the driver layer 20.

Referring to FIG. 1, prepare a touch control layer, touch control patterns, circular patterns 22, and corresponding polarized quadrilateral patterns 31 on the substrate 10. Boundary lines of the circular patterns 22 and the polarized quadrilateral patterns 31 are only visible for better understanding the patterns and do not exist in real circuits. FIG. 1 is a schematic diagram of a touch panel metal grid structure to increase the mutual capacitance. The drive circuits Tx of the circular patterns 22 are connected with one another by the bridge wires 21. The polarized quadrilateral patterns 31 are disposed across the entire screen to form Rx electrodes and two Rx electrodes are insulated from each other by a gap section 23.

In some embodiments, each of the circular patterns 22 and each of the polarized quadrilateral patterns 31 are insulated from each other by using an annular gap section 23.

In some embodiments and in the touch panel metal grid structure with augmented mutual capacitance, wherein the annular gap section 23 is disposed outside a corresponding circular pattern 22 and has a width of 1 μm-20 μm.

In some embodiments and in the touch panel metal grid structure with augmented mutual capacitance, wherein an insulating layer 40 covers the driver layer 20 and the detection layer 30.

In some embodiments and in the touch panel metal grid structure with augmented mutual capacitance, wherein the substrate 10 is an organic light emitting diode (OLED) display panel, a liquid crystal display (LCD), a glass substrate or a thin film substrate.

In some embodiments and in the touch panel metal grid structure with augmented mutual capacitance, wherein the thin film substrate comprises polyimide (PI), polyethylene terephthalate (PET) or cycle olefin polymer (COP).

Figure 2:
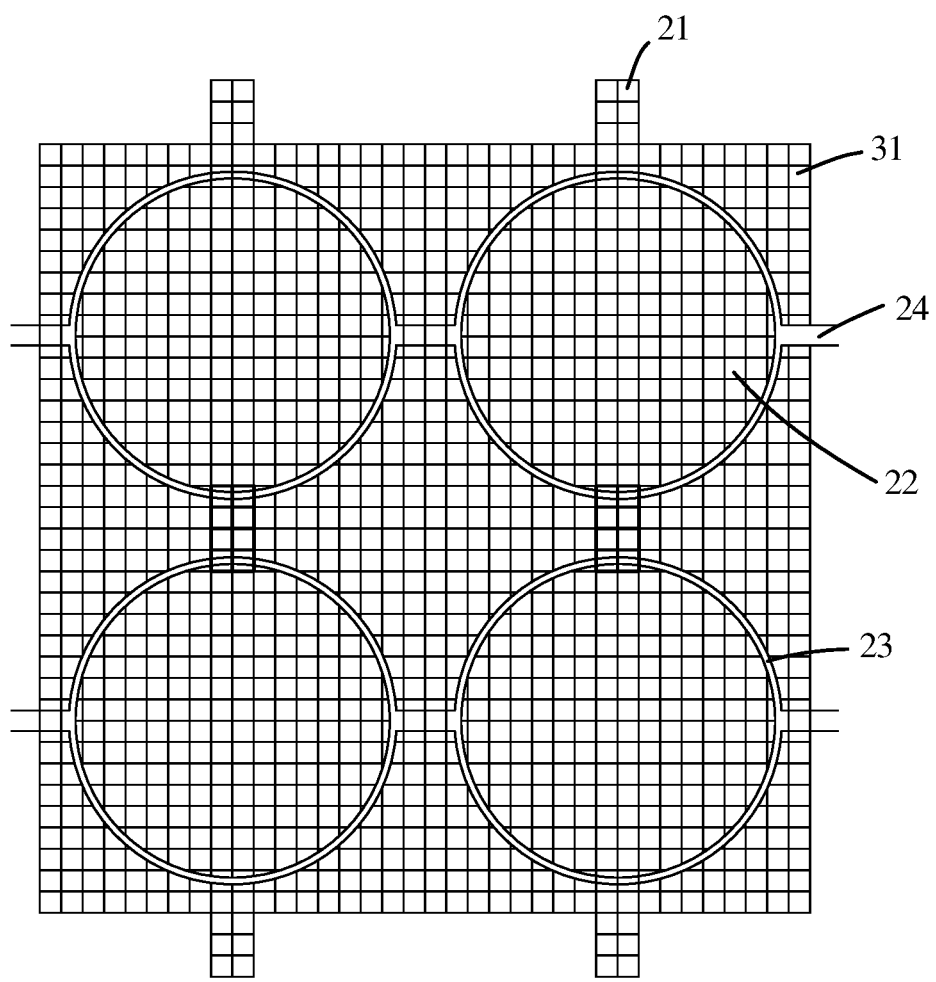
FIG. 2 is a schematic diagram of a touch control unit of a touch panel metal grid structure to increase the mutual capacitance according to the present invention.
Figure 3:
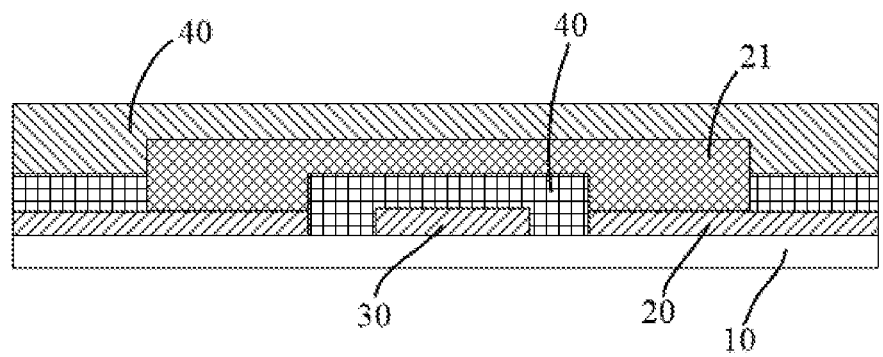
FIG. 3 is a schematic cross-sectional diagram of a bridge wire of a touch panel metal grid structure to increase the mutual capacitance according to the present invention.
Figure 4:
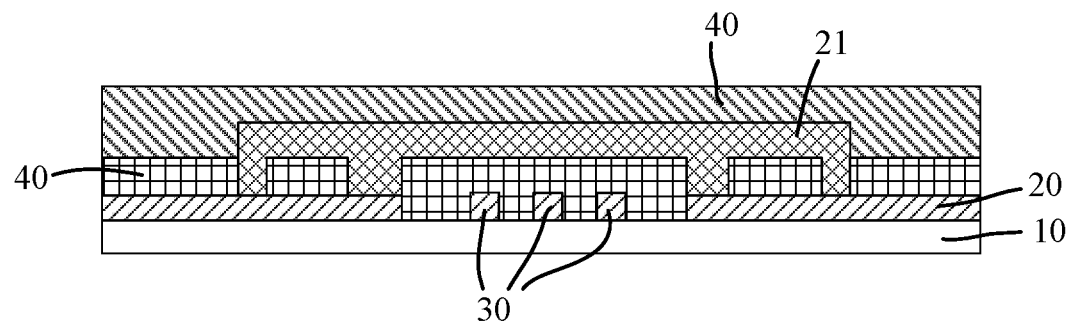
FIG. 4 is another schematic cross-sectional diagram of a bridge wire of a touch panel metal grid structure to increase the mutual capacitance according to the present invention.

FIG. 2 is a schematic diagram of a touch control unit of a touch panel metal grid structure to increase the mutual capacitance. Each of the circular patterns 22 and each of the polarized quadrilateral patterns 31 are insulated from each other by using an annular gap section 23. The annular gap section 23 surrounds outside the circular patterns 22 and the gap is formed in this area for the metal grid. The gap ranges from 1 μm-20 μm. The range varies according to actual design needs. FIG. 3 and FIG. 4 are schematic cross-sectional diagrams of a bridge wire of a touch panel metal grid structure to increase the mutual capacitance. The bridge wires are in the form of grid in a bridge point zone. The grids of the bridge wires are overlapped with the grids of the patterned layers. The design of the overlapped grids has advantages for connecting the bridge wires, such as lowering the disconnecting probability of the bridge wires 21. A portion of the bridge wire 21 in a circular pattern 22 completely connects to another circular pattern 22. In the polarized quadrilateral patterns 31, it includes a gap section 24 for insulating.

Figure 5:
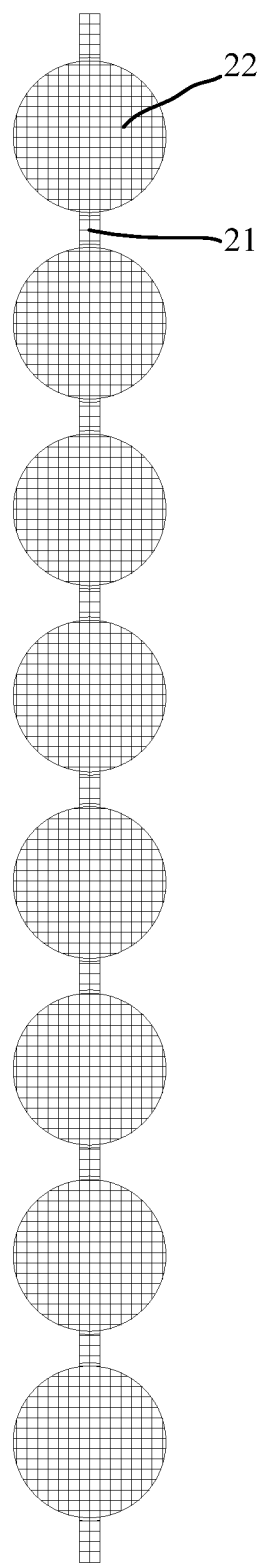
FIG. 5 is a schematic diagram of circular patterns for forming drive circuits Tx of a touch panel metal grid structure to increase the mutual capacitance according to the present invention.
Figure 6:
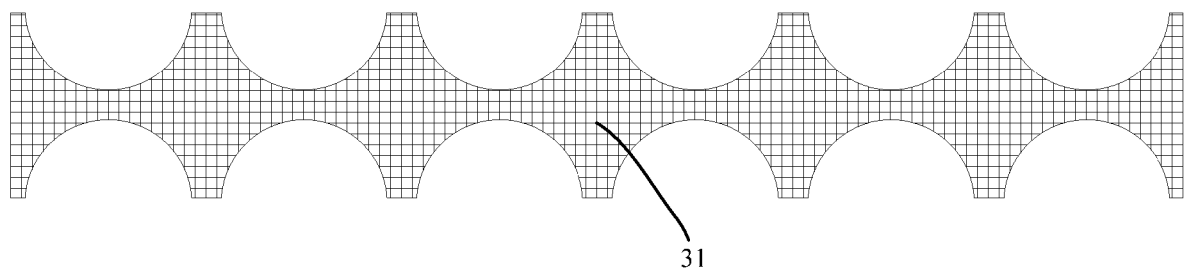
FIG. 6 is a schematic diagram of polarized quadrilateral patterns for forming sensing circuits Rx of a touch panel metal grid structure to increase the mutual capacitance according to the present invention.

Referring to FIG. 5, Tx patterns are connected with each other by bridge wires 21. Referring to FIG. 6, Rx patterns extend transversely, are insulated from each other by the gap section 24, and are insulated from Tx patterns by the gap section 24.

The present invention prepares the circular patterns 22 and the polarized quadrilateral patterns 31 on the substrate 10 and then covers with the insulating layer 40. Furthermore, the present invention engraves the bridge wires 21 to form a hollow portion and to form a bridge wire layer. The bridge wires 21 connect to circular patterns at the hollow portion. Finally, the present invention covers with an insulating layer 40. The overlapped structure can be shown as in FIG. 3 and FIG. 4. A bridge wires layer, the circular patterns 22, and the polarized quadrilateral patterns 31 are exchangeable and will not influence the effect of the present invention.

The present invention provides another embodiment such as a touch panel metal grid structure with augmented mutual capacitance having a substrate 10, a driver layer 20, a detection layer 30, a capacitance detection device (not shown), and an insulating layer 40. The driver layer 20 is disposed on the substrate 10. The driver layer 20 includes a plurality of drive components and each two said drive components being connected together by using a bridge wire 21. The detection layer 30 is disposed on the substrate 10. The detection layer 30 includes a plurality of sensing components. Each of the sensing components is disposed correspondingly to each of the sensing components. The capacitance detection device (not shown) is electrically connected to the detection layer 30 and the driver layer 20. The insulating layer 40 covers on the driver layer 20 and the detection layer 30.

In some embodiments and in the touch panel metal grid structure with augmented mutual capacitance, wherein the drive components are the circular patterns 22. The sensing components are polarized quadrilateral patterns 31. The polarized quadrilateral patterns 31 are disposed correspondingly to the circular patterns 22 to form a touch-sensing pattern. Each of the circular patterns 22 and each of the polarized quadrilateral patterns 31 are insulated from each other by using an annular gap section 23.

In some embodiments and in the touch panel metal grid structure with augmented mutual capacitance, wherein the annular gap section 23 is disposed outside a corresponding circular pattern 22 and has a disconnect width of 1 μm-20 μm.

In some embodiments and in the touch panel metal grid structure with augmented mutual capacitance, wherein the substrate is an OLED display panel, a liquid crystal display (LCD), a glass substrate or a thin film substrate.

In some embodiments and in the touch panel metal grid structure with augmented mutual capacitance, wherein the thin film substrate comprises polyimide (PI), polyethylene terephthalate (PET) or cycle olefin polymer (COP).

Figure 7:
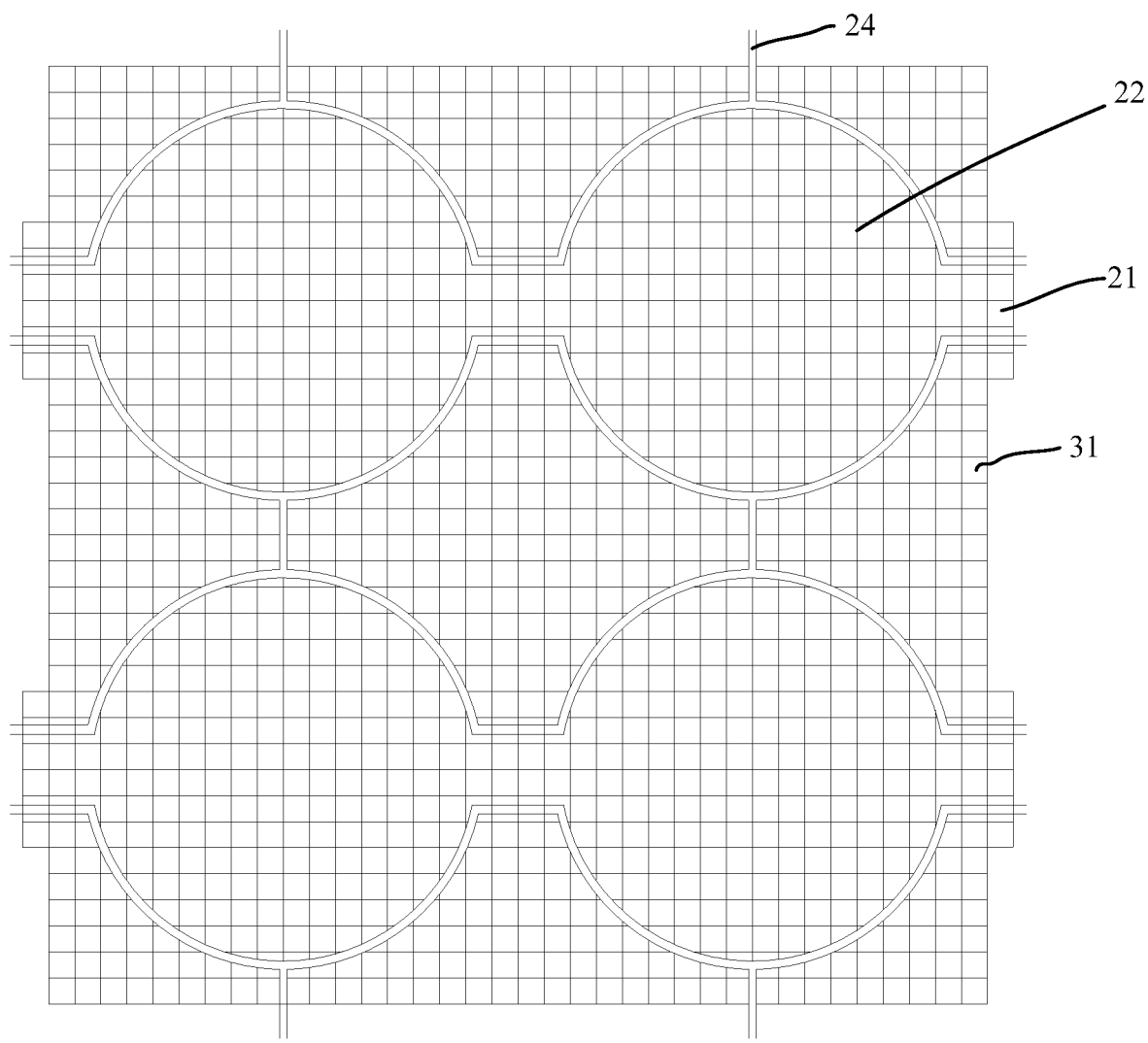
FIG. 7 is a schematic diagram of a touch control unit of a touch panel metal grid structure to increase the mutual capacitance according to a second embodiment of the present invention.
Figure 8:
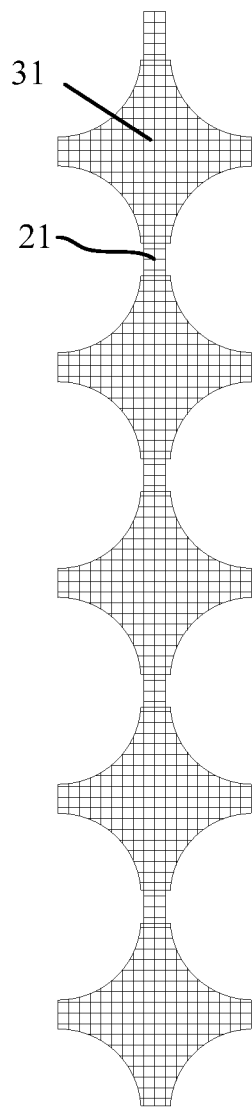
FIG. 8 is a schematic diagram of polarized quadrilateral patterns for forming drive circuits Tx of a touch panel metal grid structure to increase the mutual capacitance according to the second embodiment of the present invention.
Figure 9:
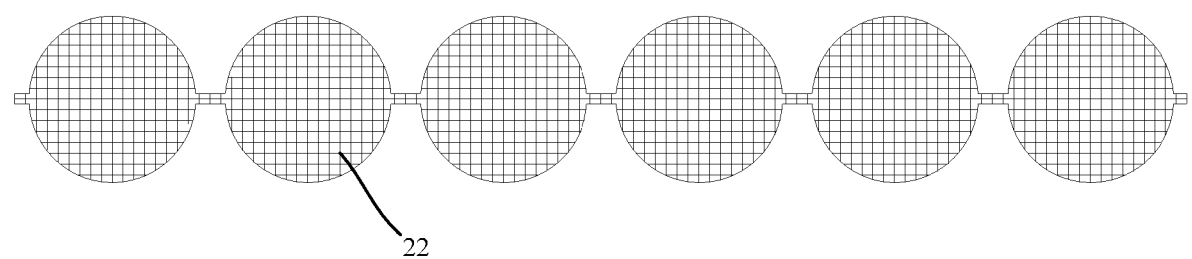
FIG. 9 is a schematic diagram of circular patterns for forming sensing circuits Rx of a touch panel metal grid structure to increase the mutual capacitance according to the second embodiment of the present invention.

Referring to FIG. 7, the present invention switches the function of the circular patterns 22 and the function of the polarized quadrilateral patterns 31. The bridge wires 21 connect to the polarized quadrilateral patterns 31 to form Tx electrodes, the circular patterns 22 extend across the display screen to form Rx patterns, and other manufacturing processes remain the same. FIG. 3 and FIG. 4 are schematic cross-sectional diagrams of a bridge wire 21. FIG. 8 is a schematic diagram of polarized quadrilateral patterns for forming drive circuits Tx. The polarized quadrilateral patterns 31 connect to Tx patterns by bridge wires 21. FIG. 9 is a schematic diagram of circular patterns for forming sensing circuits Rx. The circular patterns 22 extend across the display screen to form Rx patterns.

As shown in the two embodiments described above, the definition of Tx and Rx are used only for explanation and the real manufacturing is not limited by the definition. Tx and Rx are exchangeable according to needs. Besides, all figures are only schematic diagrams and do not mean the actual size or proportion. The present invention utilizes the circular patterns and the bridge wires and uses the metal grid as basis to invention to accomplish the embodiments of the present invention.

The present invention provides a touch panel metal grid structure to increase the mutual capacitance and enhance the touch control signal and effectively to prevent the cathode and other electric fields from interfering the signals by increasing the contact area of the drive circuit Tx and the sensing circuit Rx.

The present invention utilizes circular patterns 22 to increase a direct contact area of the drive circuit Tx and the sensing circuit Rx and to increase the mutual capacitance between Tx and Rx to enhance the touch control signals. Moreover, the present invention can effectively prevent the cathode and other electric fields from interfering in the signals. The present invention utilizes the bridge wires to connect to lower the risk of disconnection and to lower the wire resistance of the bridge wires for increasing the touch control mutual capacitance.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. A touch panel metal grid structure with increased mutual capacitance, comprising:
    a substrate;
    a driver layer disposed on the substrate, the driver layer comprising a plurality of circular patterns and each two of the circular patterns connected together by using a bridge wire;
    a detection layer disposed on the substrate, the detection layer comprising a plurality of polarized quadrilateral patterns, each of the polarized quadrilateral patterns disposed corresponding to each of the circular patterns to form a touch-sensing pattern;
    a capacitance detection device electrically connected to the detection layer and the driver layer; and an insulating layer covering the driver layer and the detection layer;
wherein each of the circular patterns and each of the polarized quadrilateral patterns corresponding thereto have different centers.

2. The touch panel metal grid structure with augmented mutual capacitance according to claim 1, wherein each of the circular patterns and each of the polarized quadrilateral patterns are insulated from each other by an annular gap section.

3. The touch panel metal grid structure with augmented mutual capacitance according to claim 1, wherein the substrate is an organic light emitting diode (OLED) display panel, a liquid crystal display (LCD), a glass substrate, or a thin film substrate.

4. The touch panel metal grid structure with augmented mutual capacitance according to claim 3, wherein the thin film substrate comprises polyimide (PI), polyethylene terephthalate (PET), or cycle olefin polymer (COP).

5. A touch panel metal grid structure with augmented mutual capacitance, comprising:
a substrate;
a driver layer disposed on the substrate, the driver layer comprising a plurality of circular patterns and each two of the circular patterns being connected together by using a bridge wire;
a detection layer disposed on the substrate, the detection layer comprising a plurality of polarized quadrilateral patterns, each of the polarized quadrilateral patterns disposed correspondingly to each of the circular patterns to form a touch-sensing pattern; and
a capacitance detection device electrically connected to the detection layer and the driver layer;
wherein each of the circular patterns and each of the polarized quadrilateral patterns corresponding thereto have different centers.

6. The touch panel metal grid structure with augmented mutual capacitance according to claim 5, wherein each of the circular patterns and each of the polarized quadrilateral patterns are insulated from each other by using an annular gap section.

7. The touch panel metal grid structure with augmented mutual capacitance according to claim 6, wherein the annular gap section is disposed outside a corresponding circular pattern and has a disconnect width ranging from 1 μm to 20 μm.

8. The touch panel metal grid structure with augmented mutual capacitance according to claim 7, wherein the driver layer and the detection layer are covered by an insulating layer.

9. The touch panel metal grid structure with augmented mutual capacitance according to claim 5, wherein the substrate is an organic light emitting diode (OLED) display panel, a liquid crystal display (LCD), a glass substrate, or a thin film substrate.

10. The touch panel metal grid structure with augmented mutual capacitance according to claim 9, wherein the thin film substrate comprises polyimide (PI), polyethylene terephthalate (PET), or cycle olefin polymer (COP).

11. A touch panel metal grid structure with augmented mutual capacitance, comprising:
a substrate,
a driver layer disposed on the substrate, the driver layer comprising a plurality of drive components and each two of the drive components being connected together by using a bridge wire;
a detection layer disposed on the substrate and comprising a plurality of sensing components;
a capacitance detection device electrically connected to the detection layer and the driver layer; and
an insulating layer covering the driver layer and the detection layer;
wherein the drive components are circular patterns, the sensing components are polarized quadrilateral patterns, the polarized quadrilateral patterns are disposed correspondingly to the circular patterns to form a touch-sensing pattern, and each of the circular patterns and each of the polarized quadrilateral patterns are insulated from each other by using an annular gap section; and
wherein each of the circular patterns and each of the polarized quadrilateral patterns corresponding thereto have different centers.

12. The touch panel metal grid structure with augmented mutual capacitance according to claim 11, wherein the annular gap section is disposed outside a corresponding circular pattern and has a disconnect width ranging from 1 μm to 20 μm.

13. The touch panel metal grid structure with augmented mutual capacitance according to claim 11, wherein the substrate is an organic light emitting diode (OLED) display panel, a liquid crystal display (LCD), a glass substrate or a thin film substrate.

14. The touch panel metal grid structure with augmented mutual capacitance according to claim 13, wherein the thin film substrate comprises polyimide (PI), polyethylene terephthalate (PET), or cycle olefin polymer (COP).

\* \* \* \* \*